United States Patent
Lewis et al.

(10) Patent No.: US 8,407,019 B2
(45) Date of Patent: Mar. 26, 2013

(54) MULTI-CIRCUIT DIRECT CURRENT MONITOR WITH MODBUS SERIAL OUTPUT

(75) Inventors: James E. Lewis, Hillsboro, OR (US); Stephen E. Herzog, Hillsboro, OR (US)

(73) Assignee: Leviton Mfg. Co., Melville, NY (US)

(*) Notice: Subject to any disclaimer, the term of this patent is extended or adjusted under 35 U.S.C. 154(b) by 24 days.

(21) Appl. No.: 13/207,590

(22) Filed: Aug. 11, 2011

(65) Prior Publication Data
US 2011/0295535 A1 Dec. 1, 2011

Related U.S. Application Data

(62) Division of application No. 12/288,956, filed on Oct. 24, 2008.

(60) Provisional application No. 60/984,497, filed on Nov. 1, 2007.

(51) Int. Cl.
G01R 19/00 (2006.01)
G01R 19/165 (2006.01)
G08B 29/00 (2006.01)
H01L 31/042 (2006.01)

(52) U.S. Cl. ............. 702/64; 702/65; 340/506; 136/244

(58) Field of Classification Search .................. 136/244, 136/290, 293, 291; 235/375–377, 419, 424–426, 235/440, 449, 128; 324/207, 13, 207.14, 324/207.2, 216, 263, 512, 522, 761.01, 117, 324/76.11; 340/506, 509, 511, 635, 657, 340/664, 815.4–815.45; 702/64, 57, 65, 702/188, 182–185, 179; 323/368
See application file for complete search history.

(56) References Cited

U.S. PATENT DOCUMENTS

| | | | |
|---|---|---|---|
| 6,339,538 B1 * | 1/2002 | Handleman | 363/95 |
| 6,433,522 B1 | 8/2002 | Siri | |
| 7,349,761 B1 | 3/2008 | Cruse | |
| 2004/0056768 A1 * | 3/2004 | Matsushita et al. | 340/541 |
| 2008/0147335 A1 * | 6/2008 | Adest et al. | 702/64 |
| 2008/0238195 A1 | 10/2008 | Shaver et al. | |
| 2009/0012917 A1 * | 1/2009 | Thompson et al. | 705/412 |
| 2009/0222224 A1 * | 9/2009 | Lewis et al. | 702/64 |
| 2010/0106339 A1 * | 4/2010 | Little et al. | 700/293 |

OTHER PUBLICATIONS

Product Datasheet for DC Current Monitor A89DC-08B, Obvius, LLC, Jun. 21, 2010, 2 pgs.
Installation and Operation Manual, A89DC-08—DC Current Monitor, Obvius, LLC, Jun. 21, 2010, 15 pgs.

* cited by examiner

*Primary Examiner* — Michael Nghiem
*Assistant Examiner* — Ricky Ngon

(57) ABSTRACT

A multi-circuit direct current monitor consists of a plurality of Hall Effect current sensors mounted on a printed circuit board oriented to sense the direct current (DC) flow from power generating devices such as solar arrays, output from the Hall Effect sensors connected to an analog to digital (A/D) converter which in turn is connected to a microprocessor. The multi-circuit direct current monitor continuously monitors instantaneous and average current values for each circuit as well as total instantaneous current and average current for all active circuits. The multi-circuit direct current monitor provides continuous communications via Modbus RTU as well as providing alarm outputs if one or more circuits deviates from the average output by a percentage greater than the user specified threshold for a user-defined period of time to detect failed or underperforming power output devices.

54 Claims, 5 Drawing Sheets

| | |
|---|---|
| 28 | 0 40001 INT32 MSW TOTAL CURRENT, INSTANTANEOUS AMPS*100, EG 1234=12.34A (SUM OF 8 CHANNELS)<br>1 40002 INT32 LSW TOTAL CURRENT, INSTANTANEOUS AMPS*100, EG 1234=12.34A (SUM OF 8 CHANNELS)<br>2 4003 INT32 MSW TOTAL CURRENT, LONG AVERAGE AMPS*100 (SUM OF 8 CHANNELS)<br>3 4004 INT32 MSW TOTAL CURRENT, LONG AVERAGE AMPS*100 (SUM OF 8 CHANNELS) |
| 29 | 4 4005 INT16 AVERAGE CURRENT, INSTANTANEOUS AMPS*100 (AVERAGE OF 8 CHANNELS)<br>5 4006 INT16 AVERAGE CURRENT, LONG AVERAGE AMPS*100 (AVERAGE OF 8 CHANNELS) |
| 30 | 6 40007 UNIT16 ALARM CHANNEL: 0=NO ALARM, 0xFFF=INVALID, 1-8=RANGE ALARM CHANNEL<br>7 40008 UNIT16 ALARM TIME:0xFFF= NO ALARM/INVALID, 1-65534=NUMBER OF SECONDS THAT ALARM AVERAGE HAS BEEN IN EFFECT |
| 31 | 8 40009 INT16 INIT16 PCB TEMPERATURE, IN DEGREES, f, X100, EG 12345=123.45 DEG F<br>9 40010 UNIT16 INPUT POWER SUPPLY, VOLTS X100, EG 2345=23.45V |
| 32 | 10 40011 INIT 16 CHANNEL 1 CURRENT, INSTANTANEOUS AMPS*100<br>11 40011 INT 16 CHANNEL 2 CURRENT, INSTANTANEOUS AMPS*100<br>12 40011 INT 16 CHANNEL 3 CURRENT, INSTANTANEOUS AMPS*100<br>13 40011 INT 16 CHANNEL 4 CURRENT, INSTANTANEOUS AMPS*100<br>14 40011 INT 16 CHANNEL 5 CURRENT, INSTANTANEOUS AMPS*100<br>15 40011 INT 16 CHANNEL 6 CURRENT, INSTANTANEOUS AMPS*100<br>16 40011 INT 16 CHANNEL 7 CURRENT, INSTANTANEOUS AMPS*100<br>17 40011 INT 16 CHANNEL 8 CURRENT, INSTANTANEOUS AMPS*100 |
| 33 | 18 40019 INIT16 CHANNEL 1 CURRENT, LONG AVERAGE AMPS*100<br>19 40019 INIT16 CHANNEL 2 CURRENT, LONG AVERAGE AMPS*100<br>20 40019 INIT16 CHANNEL 3 CURRENT, LONG AVERAGE AMPS*100<br>21 40019 INIT16 CHANNEL 4 CURRENT, LONG AVERAGE AMPS*100<br>22 40019 INIT16 CHANNEL 5 CURRENT, LONG AVERAGE AMPS*100<br>23 40019 INIT16 CHANNEL 6 CURRENT, LONG AVERAGE AMPS*100<br>24 40019 INIT16 CHANNEL 7 CURRENT, LONG AVERAGE AMPS*100<br>25 40019 INIT16 CHANNEL 8 CURRENT, LONG AVERAGE AMPS*100 |

FIG. 3

| | | |
|---|---|---|
| 34 | 1000 41001 UNIT16 RO/NV CAL-DATA SERIAL NUMBER (BYTES 1,2)<br>1001 41002 UNIT16 RO/NV CAL-DATA SERIAL NUMBER (BYTES 3,4)<br>1002 41003 UNIT15 RO/NV CAL-DATA SERIAL NUMBER (BYTES 5,6) | |
| 35 | 1003 41004 UNIT16 RO FIRMWARE FIRMWARE VERSION MAJOR<br>1004 41005 UNIT16 RO FIRMWARE FIRMWARE VERSION MINOR | |
| 36 | 1005 41006 UNIT16 RO/NV CAL-DATA MFG DATE MSW<br>1006 41007 UNIT16 RO/NV CAL-DATA MFG DATE LSW | |
| 37 | 1007 41008 UNIT16 RO UP TIME (SECONDS) MSW<br>1008 41009 UNIT16 RO UP TIME (SECONDS) LSW | |
| 38 | 1009 41010 UNIT16 RW/NV PREFS OUR MODBUS ADDRESS | |
| 39 | 1010 41011 UNIT16 RO/NV CAL-DATA HARDWARE VERSION (8908)<br>1011 41012 UNIT16 RO/NV CAL-DATA PCB REV (0=REV A, ETC) (LOW BYTE PART REV) | |
| 40 | 1012 41013 UNIT16 RW/NV PREFS MINIMUM CURRENT THRESHOLD FOR ALARM FEATURE, AMPS*100 | |
| 41 | 1013 41014 UNIT16 RW/NV PREFS DEVIATION THRESHOLD FOR ALARM FEATURE, PERCENT*100 | |
| 42 | 1014 41015 UNIT16 RW/NV PREFS DEVIATION MINIMUM TIME FOR ALARM FEATURE, IN SECONDS | |
| 43 | 1015 41016 UNIT16 RW/NV PREFS CHANNEL ENABLE: BITMAP OF CHANNELS TO ENABLE | |
| 44 | 1016 41017 UNIT16 W AVE-CLEAR; WRITE ANY VALUE TO CLEAR LONG AVERAGE | |

FIG. 4

MULTI-CIRCUIT DIRECT CURRENT MONITOR WITH MODBUS SERIAL OUTPUT

CROSS-REFERENCE TO RELATED APPLICATIONS

This application is a division of U.S. patent application Ser. No. 12/288,956, filed Oct. 24, 2008, which application claims the benefit of U.S. Provisional App. No. 60/984,497, filed Nov. 1, 2007.

BACKGROUND OF THE INVENTION

The present invention relates to a device for monitoring multiple DC electrical currents using sensors and, more particularly, to a device for monitoring performance of multiple solar arrays with the sensors. This is referred to as Multi-Circuit Direct Current Monitor (MCDCM) for purposes of this application.

Many commercial and institutional building owners are installing solar arrays to provide electrical energy that can be used at the facility and, in some cases, sold back to the utility providing power to the facility. There are a number of elements that are monitored in these systems, both to measure the amount of power produced and consumed in the facility and to ensure that the solar panels and arrays are functioning at peak efficiency. A typical large scale (>100 kilowatts) installation has a number of components that combine to produce usable power at the facility level. The primary component of the installation is the solar panel which is a device composed of multiple individual photovoltaic (PV) cells mounted in a weather-proof enclosure for installation on a roof top or other suitable location. Each of these solar panels produces a direct current (DC) power output from the radiation of the sunlight striking the panel. Typical power outputs for commercial solar panels are in the range of 50 to >200 watts, with voltages from 17 to 35 volts DC. For increased efficiency, multiple solar panels are electrically connected into "strings" of up to 12 individual panels to provide a single DC output for each string that sums the power from each individual panel. The output from each of these strings is then wired into a combiner, which sums the power of multiple strings into a single DC output. The DC power from the combiner (either singly or in series with other combiner boxes) is then sent to an inverter, which converts the DC output of the total solar array into 60 Hz alternating current (AC) which can then be used by the facility for its power needs. In some cases, the facility owner may contract with its existing utility to sell the power back to the utility if there is solar generating capacity that exceeds the needs of the facility itself.

For most commercial installations, the only required monitoring is the metering device that measures the AC power generated from the inverter of the solar array and the power consumed by the facility to meet its needs. This may require one or more meters to measure the bi-directional flow of AC power and is generally referred to as a "net meter", a term which simply refers to the ability of the meter(s) to measure the net amount of power consumed by the facility less the power produced by the solar array (or other local generating sources such as generators). The net amount will be positive (i.e. the facility owes a dollar amount to the utility) or negative (i.e. the facility has produced power in excess of its needs and is owed money from the utility for this production). These meters are generally specified by the utility in conjunction with the installer and will provide outputs (generally Modbus or pulse) that can be monitored by the utility or a third party data acquisition system. These meters are used for billing purposes, but they provide little if any useful information about the operation of the strings or arrays of the solar system other than to provide a summary of the AC power output from the inverter.

The purpose of the solar array is, of course, to provide power output whenever conditions are conducive to the production of power from the available sunlight. The theoretical maximum solar energy available is 1000 W/m$^2$ (based on the amount of solar radiation at the equator at noon on an equinox day) and the efficiency of a PV cell is a measure of the percentage of the maximum power potential and the actual output of the cell. For example, a PV cell with a 12% efficiency would produce approximately 120 W/m$^2$ (1000 W/m$^2$×12%) at noon at the equator on an equinox day. Most commercial PV panels in use today have rated efficiencies of between 10% and 20%. The actual output of any given panel is affected by a number of factors, including the geographic location of the array, the angle of incidence, and the number of days of sunshine. The output of the panel may also be impacted on a short term basis by cloud cover, dirt, obstructions, or failure of any of the electrical components or connections. The net meter previously described can only provide a general indication of the performance of the array, but cannot provide additional information regarding any of the components in the overall solar system.

There are several external factors which may be measured in order to determine if the solar array and its individual components are functioning properly and providing suitable power output. Environmental indicators that may be monitored include (but are not limited to) the following: solar radiance (in W/m$^2$), temperature (in °F. or °C.), humidity (in % RH), wind speed (in miles/hour or km/hour), and wind direction. These can either be measured using individual sensors connected to an input/output module or the sensors may be incorporated into a weather station package that provides a serial output (e.g. Modbus RTU) that can be read by a computer or a data acquisition server. In the case of the weather station, the single serial output provides data for each of the connected devices/components. Monitoring these environmental factors allows the owner/installer to determine what impact (if any) changes in weather condition had on the expected performance of the solar array. For example, measuring the solar radiation (using a pyranometer) provides a basis for evaluating the impact of smog or haze on the output of the solar arrays and the other environmental factors can be considered in a similar manner to compare actual performance versus expected performance of the array.

The external environmental factors previously described can provide insight into the performance of the solar array, but they do not provide a means for locating and identifying other issues which may arise within the solar power system. Monitoring the inverter(s) on the solar system can provide information regarding the operation of the inverter itself, in particular the efficiency of the inverter in converting the incoming DC power into useful AC power. Tracking the input DC power and the output AC power (in conjunction with the weather monitoring system described previously) can help the owner/installer to identify problems that arise such as electrical failures or obstructions on the solar array as a whole, but does not provide information regarding the source of the inefficiency unless the inverter itself is at fault. For example, dirt or debris can accumulate on the surface of the solar panel and this will greatly reduce the amount of power produced by the panel as the sunlight is prevented from reaching the solar cell. This information can only be gained by monitoring DC power output at the panel level or the string level and using this data to determine if one or more panels are not operating at expected efficiency. Monitoring of DC power at the string level (typically 12 panels per string) provides sufficient accuracy to permit identification of problems at the individual panel or string that affect power output. This can be accomplished by using individual Hall Effect sensors or shunts to measure the DC current from each string, but this approach requires significant space for installation and also requires a number of additional devices and installation labor to bring each of the signals into an analog input device for communication to the data acquisition system as well as significant configuration labor to provide appropriate scaling factors.

What is desired, therefore, is a sensing device which provides DC current sensing for multiple power feeds into a single device which continuously measures the DC current from each string and provides an output for all desired parameters. This device may be suitable for both new installations and for retrofit into existing arrays after installation has taken place. This device may be accurate enough to provide indication of the failure of any PV cell in the string. The device may also provide for a comparative analysis of the monitored circuits to provide indication of failed or failing panels based on a threshold of variance for one circuit from the value of other circuits, allowing for accurate reporting of failures across a wide spectrum of solar performance due to external factors (e.g. cloudy day).

The foregoing and other objectives, features and advantages of the invention will be more completely understood upon consideration of the following detailed descriptions of the invention, taken in conjunction with the accompanying drawings.

BRIEF DESCRIPTION OF THE SEVERAL VIEWS OF THE DRAWINGS

FIG. 3 is a Modbus register list for the measured variables using the RS 485 serial output.

FIG. 4 is a Modbus register list for system information parameters using the RS 485 serial output.

DETAILED DESCRIPTION OF PREFERRED EMBODIMENT

Many commercial and institutional building owners are installing solar photovoltaic systems to reduce their operating costs by generating electricity when sufficient solar energy is available and, in some cases, to sell power back to the utility when there is excess power available from the solar system. In addition to the potential savings and income generated from the solar system, there are significant incentives available from the utilities and from local, state and federal government entities. Most of these installations are performed by contractors who specialize in solar projects, and these contractors may or may not provide guarantees of performance to the owners or may share in the savings generated. Regardless of who benefits from the installation of the solar generating system, the only way to increase the return on investment (and recover the incentives) is to provide monitoring of operational parameters, both for the system as a whole and its component parts. If the system is not monitored on a "continuous" basis (or frequently), failures will occur that will not be identified in a timely manner and will result in a reduced return on investment. Most systems include weather monitoring equipment and metering systems to measure the net flow of power, but these monitoring points are insufficient to assist in identifying where problems are occurring. A drop in expected power production from a failure of a string or panel can not be corrected without extensive labor and downtime to isolate and identify where the problem occurred. What is needed is a system for monitoring the performance of individual strings using devices which can identify and communicate problems automatically, preferably using industry standard communications protocols. This device should be capable of installation in both new and existing solar generating systems without significant costs and should integrate "seamlessly" into existing monitoring systems.

Figure 1:
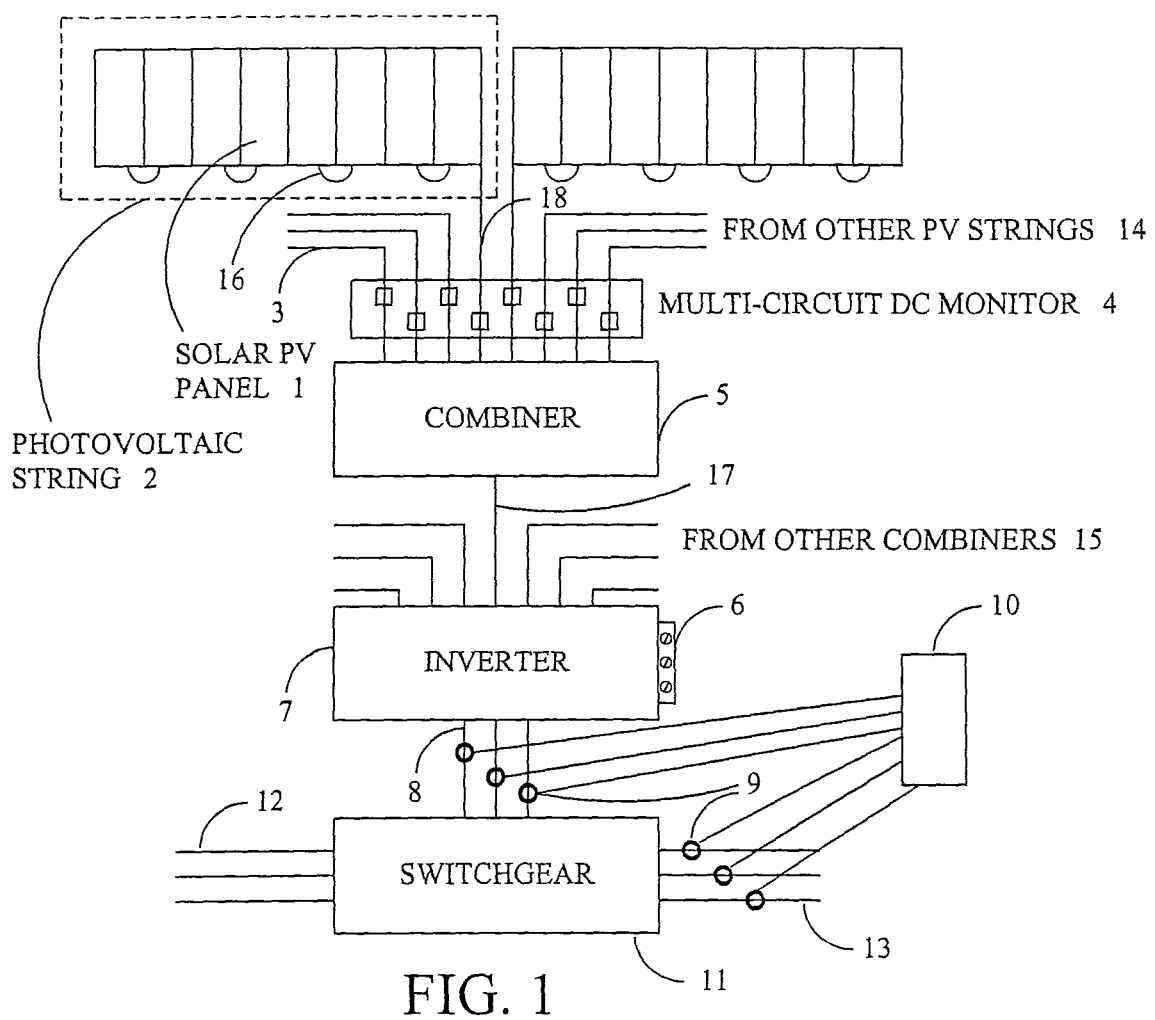
FIG. 1 is a diagram of a typical commercial solar installation.

Referring to FIG. 1, an exemplary commercial solar system and its components is illustrated. A collection of solar PV panels 1 is selected to meet the desired power output of the overall system (e.g. if the system is intended to produce 100 kilowatts of power, the system would be specified for 500 panels with 200 watts of power per panel). Each of these individual solar panels are wired in series 16 with several other panels (typically eight to twelve panels) to form a PV string 2 which sums the power output 18 from each of the panels. For example, if twelve 200 watt panels are connected in a string, the power output from the string would be 2400 watts. The output from this PV string is wired to a combiner box 5 with the outputs from other strings 14. The output from each of the PV strings 14 and 18 is inserted through the opening in one of the sensors in the multi-circuit DC monitor (MCDCM) 4, providing a technique of monitoring the DC current flow from each of the PV strings (detailed description of the operation of the multi-circuit DC monitor is provided elsewhere). Any suitable sensor may be used. The multi-circuit DC monitor provides a serial port which allows multiple points to be read by the monitoring system from a single communications port utilizing a suitable protocol. One suitable protocol is the open Modbus RTU protocol (see FIG. 5). The combiner box 5 performs several ancillary functions including safety and circuit protection; the primary purpose of the combiner box is to provide a cumulative DC power output 17 that is the sum of the inputs from all of (or a plurality of) the strings 14 and 18.

The inverter 7 performs the function of converting the direct current (DC) power of the solar panels into three phase alternating current (AC) power which can be used by the facility to meet its power needs as commercial power systems require three phase AC power (typically 208 V or 480 V AC). The inverter accepts combined DC outputs from multiple combiner boxes 17 which in turn take in multiple strings in the same manner as described above for the combiner in FIG. 1. Each of these additional combiner boxes would have an MCDCM 4 to provide the same monitoring as that shown in FIG. 1. The inverter typically utilizes a serial output 6 that provides information on operating parameters that can be monitored along with other components of the system to provide timely indication of system performance. The inverter serial outputs may utilize Modbus RTU protocol to allow monitoring systems to read multiple parameters (e.g. DC input power, AC output power, inverter efficiency) from a single communication port (see FIG. 5). The three phase AC power 8 leaves the inverter and is wired into the switchgear of the facility 11 where the AC output of the solar system is matched to supply power of the facility 13 and, if applicable, to the utility grid 12. If the demand of the facility for power is less than the power provided by the solar system, the excess power can be sold back to the utility. If the demand for power from the facility is greater than the power provided by the solar system, the switchgear will draw the additional power required from the utility feeds 12.

The billing and reconciliation for the power used in the facility is accomplished by a net meter 10. This net meter uses two sets of current transformers 9 connected to the net meter which measure the amperage flow from the solar system and into the facility. The net meter combines the amperage values from these current transformers with a voltage connection to calculate the power in kilowatts that is provided from the solar system and used by the facility. This net meter is usually connected to a third party monitoring system to verify the power produced and purchased to reconcile the associated charges to and from the utility. Many net meters also provide an auxiliary communications option (usually Modbus RTU) which can be monitored by the solar monitoring system in FIG. 5.

Figure 2:
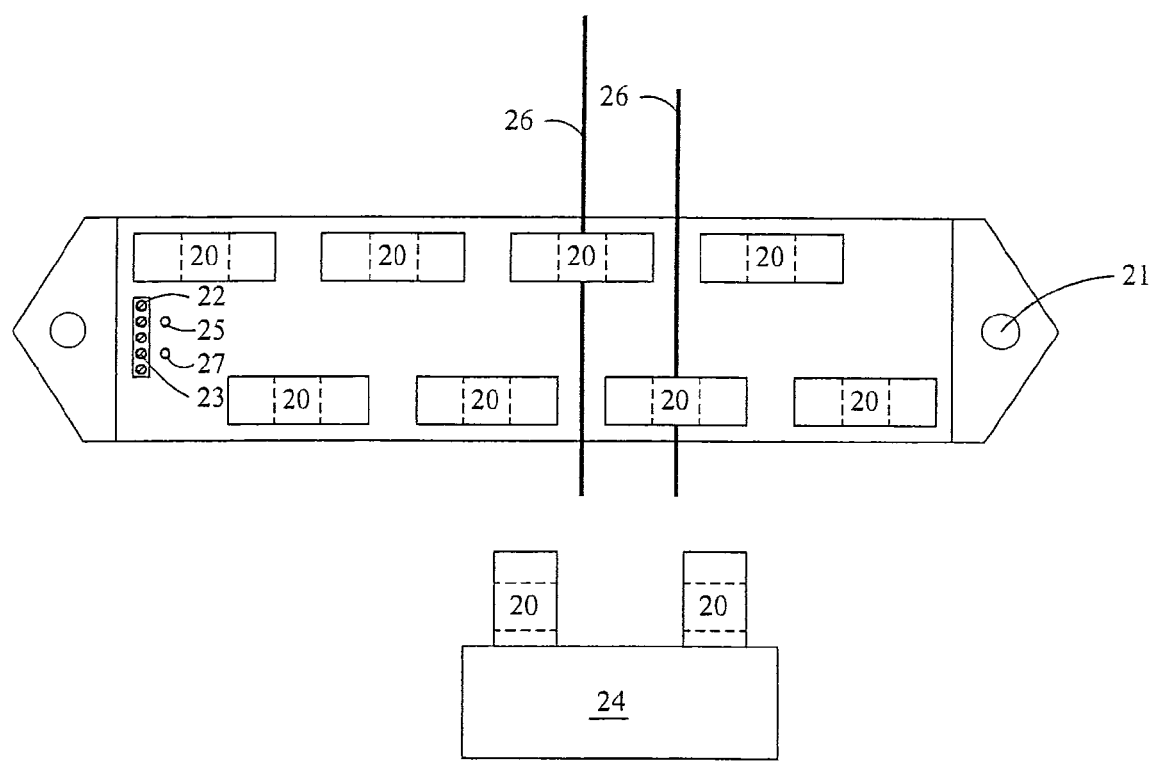
FIG. 2 is a detailed dimensional drawing.

Referring in detail to the drawings of the physical layout and dimensions of the multi-circuit DC monitor, referring in particular to FIG. 2, the MCDCM consists of a metal housing 24 with mounting tabs 21 for installing the MCDCM. In a typical installation, the device is mounted inside an enclosure that meets the environmental requirements where the device is installed. The dimensions of the device allow for it to be installed inside a standard combiner box in either a new construction or retrofit installation. The primary sensing components of the device are preferable eight Hall Effect sensors 20 which provide for non-contact sensing of DC current flows without the need for standard current transducers or other current sensing components. The device is mounted in the combiner box or other enclosure such that the long edge of the device is substantially perpendicular to direction of the wires 26 carrying current from the solar PV strings. The wires from the strings 26 are placed through the openings in the Hall Effect sensors, one conductor per sensor. The Hall Effect device measures the current flowing in the conductor by measuring the effect of magnetic field generated from the current flowing in the conductor on a Hall Effect sensor mounted in a gap in the flux material of the device (the magnetic field generated by the current flow is proportional to the amount of current flowing in the conductor). Additional circuitry in the Hall Effect sensor amplifies the low level signal generated by the Hall sensor to a 0 to 5 volt signal that can be read by a microprocessor. Hall effect sensors are preferably used for several reasons: first, the Hall effect sensor is encapsulated to prevent dust or corrosion from affecting the accuracy; second, the Hall Effect sensor is non-intrusive and thus provides and intrinsic barrier to the voltage being supplied on the monitored conductor; third, the closed loop circuitry of the Hall effect sensor provides greater accuracy than other sensors; and finally, the Hall Effect sensor does not add resistance to the flow of the current in the conductor as is the case with other sensor types such as shunts. The MCDCM provides two light emitting diodes (LED's) 27 and 25 for power indication and serial transmission respectively. The MCDCM has three screw terminals 22 for connecting to a Modbus RTU serial communications network (terminals are +, −, and shield). The MCDCM has two terminals 23 for input power (24 VDC at 500 mA).

Referring in detail to the Modbus register list in FIG. 3 and FIG. 4, the instantaneous amperage value of each sensor input (Modbus registers 40011 through 40018 inclusive) 32 is calculated by the ARM 7 microprocessor in the following manner: the microprocessor of the invention receives up to 32 sample readings from the ND converter for each of the inputs and averages these 32 readings and updates the instantaneous amperage value stored in the Modbus register for the channel being read. This process is repeated for each of the input channels to update each of the Modbus register values on a continuous basis. Each of these readings is stored as a twos complement, signed value.

In addition to the instantaneous amperage value for each input circuit outlined above, the MCDCM maintains a "long average" for each channel, which is a calculated average for each channel over time (Modbus registers 40019 through 40026) 33. This value is designed to provide the average of the instantaneous values for each channel for a particular time interval selected by the user (e.g. 1 minute or 1 hour) to provide a longer average period than the instantaneous. These values are typically cleared by the data acquisition device by setting the Modbus register 41017 44 to any value which clears all the long average values.

The MCDCM provides detection of a failed or underperforming circuit (e.g. a single solar panel in a string) by sending an output alarm via Modbus RTU if the instantaneous amperage of any of the 8 DC inputs falls below a threshold established by the user. The MCDCM calculates the instantaneous value from each of the Hall Effect sensors and compares it to the alarm deviation value set using Modbus register 41014 41 and stores the value as being in alarm if the instantaneous value is less than the minimum deviation in register 41014 41. If the instantaneous value has been in alarm for greater than the minimum time set in Modbus register 41015 42, the MCDCM sets the alarm channel value in Modbus register 40007 30 from 0 to 1-8 (depending on which channel is in alarm). This information will then be uploaded on the next request for data from the Modbus master device on the RS 485 port.

Referring in detail to the Modbus register list in FIG. 4, in addition to the read-only registers described in FIG. 3 (Modbus registers 40001 through 40026 inclusive) described previously, the MCDCM provides a number of registers (all unsigned 16 bit integers) that contain system information for the user and allow for programming input. Modbus registers 41001 through 41003 34 are read only non-volatile registers that contain serial number and calibration data. These values are set at the factory and are not field programmable. Registers 41004 through 41007 35 and 36 are also read-only non-volatile values set at the time of production that contain the firmware version information and manufacturing date. Modbus registers 41008 and 41009 37 are read-only registers that monitor up-time (operating time) in the field in seconds. Registers 41011 and 41012 39 are read-only registers stored in non-volatile memory that provide information regarding the hardware version of the device and the printed circuit board revision respectively.

Modbus register 41010 38 is a read/write register that allows the unique Modbus address to be written to the non-volatile memory. This Modbus address can be written to the register in the field allowing the user to assign an address that does not conflict with other Modbus devices on the same network.

Register 41013 40 is a read/write register that stores the minimum threshold for alarm values. This allows the user to eliminate "nuisance" alarms by disabling the alarm deviation feature if the instantaneous current falls below the level set in register 41013 40. Register 41014 41 is a read/write non-volatile value that establishes the minimum alarm threshold as a percentage of the instantaneous total current calculated in registers 40001 and 40002 28. This value can be changed by the user to set a threshold that corresponds to actual conditions. Register 41015 42 is also a read/write non-volatile value that contains the minimum time (in seconds) that a particular channel needs to be in alarm before the alarm register 40007 30 is set to an alarm condition. This value can be modified by the user to meet the needs of the particular circuits being monitored. Register 41016 43 is a read/write non-volatile register that allows the user to disable monitoring of instantaneous amperage values for any channels, allowing the user to minimize nuisance alarms for any channels that are not used either temporarily or permanently. Register 41017 44 is a write only value that clears all long average values (Modbus registers 40003-40004 28 and 40019-40026 33). This allows the user to clear average values at the end of a log cycle (if desired) and to initiate a new long average calculation.

Figure 5:
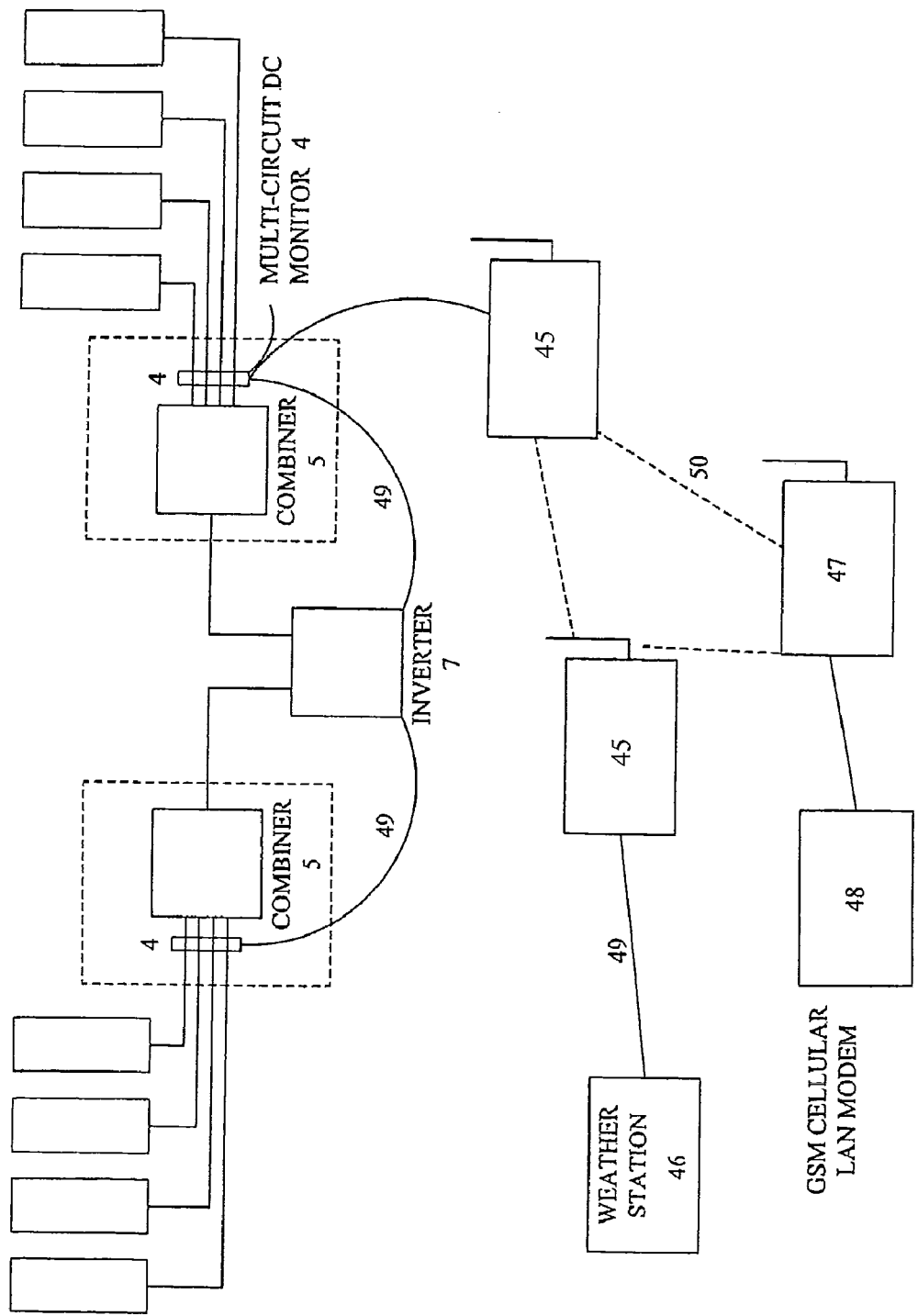
FIG. 5 is a diagram of a complete monitoring system for commercial solar photovoltaic systems.

Referring in detail to the solar monitoring system shown in FIG. 5, the MCDCM 4 is shown as it would be used in a typical Modbus data acquisition system for logging and monitoring solar array performance. In this image, the DC output 14 of the solar photovoltaic strings 2 is monitored by the MCDCM 4 as they enter the combiner box 5 as described in detail previously. Serial communications with the MCDCM's is accomplished using a twisted pair of wires 49 carrying the Modbus protocol transmission from the master data acquisition device 48 which also queries other Modbus devices (e.g. the inverter 7 or a Modbus weather station 46 on user-selected intervals). Data from the Modbus devices is transmitted using either twisted pair wires 49 or wirelessly using wireless Modbus transceivers 45, 47 to send data on a mesh radio network 50 where wiring is not practical or cost-effective.

In a typical installation, the data acquisition system functions in the following manner:
1. The data acquisition master device 48 initiates a request for Modbus register data from one or more connected Modbus devices using the master wireless mesh transceiver 47 to send the request wirelessly to other transceivers 45 and then to the Modbus device (e.g. MCDCM 4 or inverter 7).
2. The MCDCM 4 (or other Modbus device) responds to the request by sending the value(s) stored in the requested register(s) using the same communications chain to the data acquisition device 48 which stores or forwards the data to a remote database server for long-term storage and display.
3. The data acquisition device 48 typically time stamps the received Modbus data and stores it in non-volatile memory till an upload request is received (upload may be automatic based on time parameters stored in the data acquisition device).
4. At this point, the data is converted to an open format (HTTP, xml, among others) and is communicated via the internet using either a local area network (LAN), phone line or a cellular network.

The data acquisition device can also provide near real-time data from any of the Modbus devices when a request is made from an external laptop or PC running a web browser if the external device is on a sub-net with the data acquisition device.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

We claim:

1. A method for monitoring direct current (DC) supplied by a solar photovoltaic system including a plurality of solar panels; the method comprising the steps of:
   (a) providing a multi-circuit direct current monitor (MCDCM) having a microprocessor and a plurality of sensors;
   (b) coupling each of the sensors of the MCDCM to one of the plurality of solar panels;
   (c) monitoring an instantaneous current value for each sensor;
   (d) monitoring a long average current value for each sensor;
   (e) with said microprocessor, comparing the instantaneous current value for each sensor against the long average current value for each respective sensor;
   (f) sending an output alarm if the instantaneous current value for any one of the sensors deviates from the long average current value for each respective sensor by a threshold value;
   (g) with said microprocessor calculating, for each of the sensors, an average current value of the long average current value of the remaining sensors;
   (h) with said microprocessor, comparing the long average current value for each of the sensors against the average current value of the long average current value of the remaining sensors; and
   (i) sending an output alarm if the long average current value for any one of the sensors deviates from the average current value of the long average current value of the remaining sensors by the threshold value.

2. The method of claim 1 wherein the instantaneous current value for each sensor is calculated by the microprocessor via averaging a plurality of readings of the current for each sensor, wherein the number of readings for the instantaneous current is less than a number of readings used to calculate the long average current value for each sensor.

3. The method of claim 1, wherein step (d) comprises maintaining an average current value for each sensor for a particular time interval as selected by a user.

4. The method of claim 1, wherein the microprocessor stores the threshold value.

5. The method of claim 4, wherein the threshold value is a minimum instantaneous current threshold.

6. The method of claim 4, wherein the threshold value is a deviation percentage value of the instantaneous total current.

7. The method of claim 6, wherein the percentage value can be modified by a user.

8. The method of claim 4, wherein the output alarm is sent only if the instantaneous current value for any one of the sensors falls below the threshold value for a predetermined time duration.

9. The method of claim 8, wherein the predetermined time duration is set by a user.

10. The method of claim 1, further comprising enabling the user to disable the output alarm.

11. The method of claim 1, further comprising enabling the user to disable monitoring an instantaneous current value for any one sensor.

12. The method of claim 1, wherein the microprocessor maintains a bitmap for each sensor so that each sensor can be selectively enabled by the user.

13. The method of claim 1, wherein the long average current value is erased based on a time period determined by the user.

14. The method of claim 1, wherein the microprocessor includes system information.

15. The method of claim 14, wherein the system information includes factory set serial number and calibration data for the MCDCM.

16. The method of claim 14, wherein the system information includes firmware version information.

17. The method of claim 14, wherein the system information includes factory set time of production information including manufacturing date of the MCDCM.

18. The method of claim 14, wherein the system information includes total amount of up time for the MCDCM.

19. The method of claim 14, wherein the system information includes Modbus address.

20. The method of claim 14, wherein the system information includes hardware version information and print circuit board (PCB) version number information.

21. The method of claim 1, wherein each of said sensors is a Hall Effect current sensor, each of said Hall Effect current sensors includes an aperture so that a wire carrying current from the respective solar panels is inserted through the aperture in the Hall Effect current sensor.

22. The method of claim 21, wherein the MCDCM is rectangular having a length longer than a width and the MCDCM is mounted such that the length of the MCDCM is substantially perpendicular to a direction of the wires carrying current from the solar panels.

23. The method of claim 1, wherein each of said sensors communicates with another device using a single communications port.

24. The method of claim 23, wherein said communications port is an RS-485 serial port.

25. The method of claim 24, wherein said serial port communicates with said another device using Modbus RTU protocol.

26. The method of claim 1, wherein the plurality of solar panels are electrically connected to one another to form a photovoltaic string, and each of the sensors of the MCDCM is connected to one of the plurality of photovoltaic strings so that each of the sensors monitors the sum of the direct current (DC) supplied by the photovoltaic string.

27. The method of claim 1, further comprising the step of connecting the MCDCM to a Modbus RTU serial communications network.

28. A method for monitoring direct current (DC) supplied by a solar photovoltaic system including a plurality of solar panels; the method comprising the steps of:
(a) providing a multi-circuit direct current monitor (MCDCM) having a microprocessor and a plurality of sensors;
(b) coupling each of the sensors of the MCDCM to one of the plurality of solar panels;
(c) monitoring an instantaneous current value for each sensor;
(d) monitoring a long average current value for each sensor;
(e) with said microprocessor, comparing the instantaneous current value for each sensor against the long average current value for each respective sensor wherein the instantaneous current value for each sensor is calculated by the microprocessor via averaging a plurality of readings of the current for each sensor, wherein the number of readings for the instantaneous current is less than a number of readings used to calculate the long average current value for each sensor; and
(f) sending an output alarm if the instantaneous current value for any one of the sensors deviates from the long average current value for each respective sensor by a threshold value.

29. The method of claim 28, wherein step (d) comprises maintaining an average current value for each sensor for a particular time interval as selected by a user.

30. The method of claim 28, wherein the microprocessor stores the threshold value.

31. The method of claim 30, wherein the threshold value is a minimum instantaneous current threshold.

32. The method of claim 30, wherein the threshold value is a deviation percentage value of the instantaneous total current.

33. The method of claim 32, wherein the percentage value can be modified by a user.

34. The method of claim 30, wherein the output alarm is sent only if the instantaneous current value for any one of the sensors falls below the threshold value for a predetermined time duration.

35. The method of claim 34, wherein the predetermined time duration is set by a user.

36. The method of claim 28, further comprising enabling the user to disable the output alarm.

37. The method of claim 28, further comprising enabling the user to disable monitoring an instantaneous current value for any one sensor.

38. The method of claim 28, wherein the microprocessor maintains a bitmap for each sensor so that each sensor can be selectively enabled by the user.

39. The method of claim 28, wherein the long average current value is erased based on a time period determined by the user.

40. The method of claim 28, wherein the microprocessor includes system information.

41. The method of claim 40, wherein the system information includes factory set serial number and calibration data for the MCDCM.

42. The method of claim 40, wherein the system information includes firmware version information.

43. The method of claim 40, wherein the system information includes factory set time of production information including manufacturing date of the MCDCM.

44. The method of claim 40, wherein the system information includes total amount of up time for the MCDCM.

45. The method of claim 40, wherein the system information includes Modbus address.

46. The method of claim 40, wherein the system information includes hardware version information and print circuit board (PCB) version number information.

47. The method of claim 28, wherein each of said sensors is a Hall Effect current sensor, each of said Hall Effect current sensors includes an aperture so that a wire carrying current from the respective solar panels is inserted through the aperture in the Hall Effect current sensor.

48. The method of claim 47, wherein the MCDCM is rectangular having a length longer than a width and the MCDCM is mounted such that the length of the MCDCM is substantially perpendicular to a direction of the wires carrying current from the solar panels.

49. The method of claim 28, wherein each of said sensors communicates with another device using a single communications port.

50. The method of claim 49, wherein said communications port is an RS-485 serial port.

51. The method of claim 50, wherein said serial port communicates with said another device using Modbus RTU protocol.

52. The method of claim 28, wherein the plurality of solar panels are electrically connected to one another to form a photovoltaic string, and each of the sensors of the MCDCM is connected to one of the plurality of photovoltaic strings so that each of the sensors monitors the sum of the direct current (DC) supplied by the photovoltaic string.

53. The method of claim 28, further comprising the step of connecting the MCDCM to a Modbus RTU serial communications network.

54. The method of claim 28, further comprising the steps of:
   (a) with the microprocessor, calculating, for each of the sensors, an average current value of the long average current value of the remaining sensors;
   (b) with the microprocessor, comparing the long average current value for each of the sensors against the average current value of the long average current value of the remaining sensors; and
   (c) sending an output alarm if the long average current value for any one of the sensors deviates from the average current value of the long average current value of the remaining sensors by the threshold value.

* * * * *

UNITED STATES PATENT AND TRADEMARK OFFICE
CERTIFICATE OF CORRECTION

| | |
|---|---|
| PATENT NO. | : 8,407,019 B2 |
| APPLICATION NO. | : 13/207590 |
| DATED | : March 26, 2013 |
| INVENTOR(S) | : James E. Lewis et al. |

It is certified that error appears in the above-identified patent and that said Letters Patent is hereby corrected as shown below:

In the Specification:

Col. 5, Line 65

Change "ND" to read --A/D--.

Signed and Sealed this
Thirteenth Day of August, 2013

Teresa Stanek Rea
*Acting Director of the United States Patent and Trademark Office*